United States Patent [19]

Urai

[11] Patent Number: 4,954,729
[45] Date of Patent: Sep. 4, 1990

[54] OUTPUT BUFFER CIRCUIT USED FOR STABLE VOLTAGE SOURCE

[75] Inventor: Takahiko Urai, Tokyo, Japan

[73] Assignee: NEC Corporation, Tokyo, Japan

[21] Appl. No.: 371,865

[22] Filed: Jun. 27, 1989

[30] Foreign Application Priority Data

Jun. 27, 1988 [JP] Japan .................................. 63-159655

[51] Int. Cl.⁵ ...................... H03K 17/16; H03K 19/02; H03K 5/12
[52] U.S. Cl. .................................... 307/443; 307/451; 307/473; 307/263; 307/550; 307/571; 307/572
[58] Field of Search ............... 307/443, 448, 451, 473, 307/263, 264, 549, 550, 568, 571, 572

[56] References Cited

U.S. PATENT DOCUMENTS

| | | | |
|---|---|---|---|
| 4,779,013 | 10/1988 | Tanaka | 307/263 |
| 4,785,201 | 11/1988 | Martinez | 307/451 |
| 4,818,901 | 4/1989 | Young et al. | 307/263 |
| 4,829,199 | 5/1989 | Prater | 307/451 |

FOREIGN PATENT DOCUMENTS

60-224325 11/1985 Japan .................................. 307/473

Primary Examiner—Stanley D. Miller
Assistant Examiner—Margaret R. Wambach
Attorney, Agent, or Firm—Sughrue, Mion, Zinn, Macpeak & Seas

[57] ABSTRACT

An output buffer circuit according to the present invention has a complementary inverter circuit and a controlling circuit which produces a pair of driving signals for shifting the complementary inverter circuit between two levels, and the controlling circuit has a pull-down transistor and a pull-up transistor both shifted from the off-states to the on-states on the way between the two levels, so that the driving signals slowly swing their voltage levels in an early stage but steeply reaches the two levels, thereby eliminating any overlapping from the driving signals for elimination of undesirable concurrent on-states from the complementary inverter circuit.

11 Claims, 4 Drawing Sheets

OUTPUT BUFFER CIRCUIT USED FOR STABLE VOLTAGE SOURCE

FIELD OF THE INVENTION

This invention relates to an output buffer circuit and, more particularly, to an controlling stage for an output inverter implemented by a complementary inverter circuit.

DESCRIPTION OF THE RELATED ART

Figure 1:
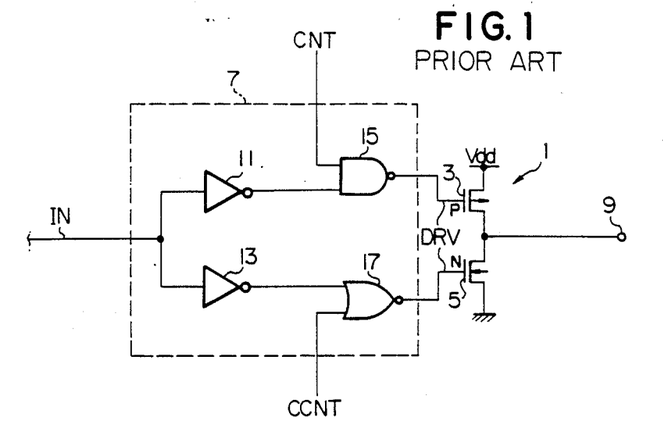
FIG. 1 is a circuit diagram showing the arrangement of a prior art output buffer circuit.

A typical example of the output buffer circuit is illustrated in FIG. 1 and largely comprises a complementary inverter circuit 1 consisting of a p-channel type field effect transistor 3 and an n-channel type field effect transistor 5, and a control circuit 7 for the complementary inverter circuit 1. The complementary inverter circuit 1 is coupled between a source of positive voltage level Vdd and a ground terminal, and an output node thereof is coupled to an output node 9. The control circuit 7 has two inverter circuits 11 and 13 supplied with an input signal IN, a two-input NAND gate 15, and a two-input NOR gate 17. The output nodes of the inverter circuits 11 and 13 are coupled in parallel to the NAND gate 15 and the NOR gate 17, and a control signal CNT and the complementary signal thereof (which is hereinbelow referred to as "complementary control signal") CCNT are supplied to the other input nodes of the NAND and NOR gates 15 and 17, respectively.

The control signal CNT and the complementary control signal CCNT are opposite in logic level to each other, and, for this reason, the NAND gate 15 and the NOR gate 17 produces a pair of driving signals DRV identical in the voltage level with each other.

In operation, while the control signal CNT is recovered to the low voltage level, the complementary control signal CCNT goes up to the high voltage level, and the output signal of the NAND gate 15 is fixed to the high voltage level, however, the output signal of the NOR gate 17 remains in the low voltage level. Thus, the NAND and NOR gates 15 and 17 respectively produces the output signal of the high voltage level and the output signal of the low voltage level, respectively, regardless of the input signal IN, and, accordingly, the p-channel type field effect transistor 3 and the n-channel type field effect transistor 5 are simultaneously turned off, thereby allowing the complementary inverter circuit 1 to enter in the high-impedance state. On the other hand, when the control signal CNT goes up to the high voltage level, and, accordingly, the complementary control signal CCNT is recovered to the low voltage level, the NAND gate 15 as well as the NOR gate 17 are activated to respond to the output signals of the inverter circuits 11 and 13 and, accordingly, the input signal IN, thereby complementarily shifting the p-channel type field effect transistor 3 and the n-channel type field effect transistor 5 between the on-states and the off-states.

The output buffer circuit illustrated in FIG. 1 is responsive to a single bit of the input signal IN, and, for this reason, a plurality of the output buffer circuits are prepared for a multiple-bit input signal.

Figure 2:
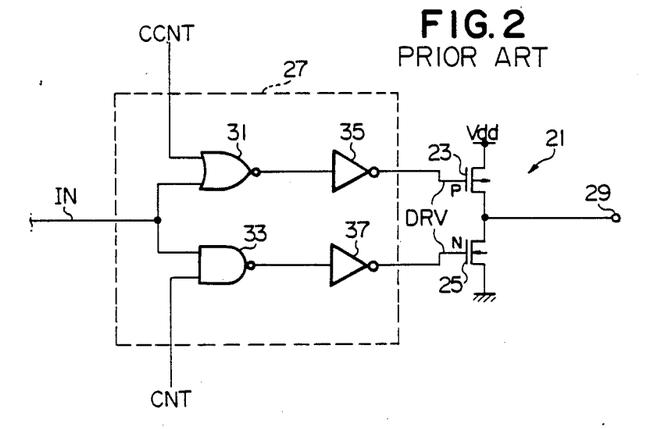
FIG. 2 is a circuit diagram showing the arrangement of another prior art output buffer circuit.

Turning to FIG. 2 of the drawings, another example of the prior art output buffer circuit also comprises a complementary inverter circuit 21 consisting of a p-channel type field effect transistor 23 and an n-channel type field effect transistor 25, and a control circuit 27 for the complementary inverter circuit 21. The complementary inverter circuit 21 is coupled between a source of positive voltage level Vdd and a ground terminal, and an output node 29 is provided between the p-channel type field effect transistor 23 and the n-channel type field effect transistor 25. The control circuit 27 has a two-input NOR gate 31, and a two-input NAND gate 33, and two inverter circuits 35 and 37. A control signal CNT and the complementary control signal CCNT are supplied in parallel to the NAND gate 33 and the NOR gate 31, and an input signal IN is shared by the NAND gate 33 and the NOR gate 31, so that the NAND gate 33 and the NOR gate 31 are entered into the high impedance states in so far as the control signal CNT remains in the low voltage level. Whenever the control signal CNT goes up to the high voltage level, the NAND gate 33 and the NOR gate 31 respectively supply the output signals identical in voltage level the inverter circuits 37 and 35 which in turn supplies the inverses thereof to the n-channel type and p-channel type field effect transistors 25 and 23 for complementarily shifting.

In general, upon designing an electronic circuit provided with the output facility, the designer should take noises into consideration, because the p-channel type field effect transistor 3 or 23 and the n-channel type field effect transistor 5 and 25 are causative of the noises on the source of positive voltage level Vdd and the ground node. Namely, since the output buffer circuit is provided for a single bit of the input signal, a plurality of the output buffer circuits are incorporated in an integrated circuit for a multiple-bit input signal, and the source of positive voltage level Vdd and the ground line are shared by the plural output buffer circuits. Those field effect transistors are usually designed to be large in current driving capability and, accordingly, causative of fluctuation on the source of positive voltage level Vdd and the ground line. For example, when the p-channel type field effect transistor and the n-channel type field effect transistor are concurrently turned on, an undesirable current path is established between the source of positive voltage level Vdd and the ground node, and, for this reason, a large amount of current flows from the source of positive voltage level Vdd and the ground node. This results in the fluctuation on the source of positive voltage level Vdd and the ground line. If the field effect transistors are rapidly switched between the on-states and the off-states, the undesirable fluctuation such as an overshoot or an undershoot takes place in the positive voltage level and the ground voltage level.

For providing a solution for the concurrent on-states, a time delay is introduced in the driving signals DRV, and the control circuit retards one of the driving signals DRV, thereby preventing the p-type and n-channel type field effect transistors from the concurrent on-states. If the p-channel type field effect transistor is, by way of example, turned on and the n-channel type field effect transistor is turned off, the control circuit firstly causes the p-channel type field effect transistor turns off, and, then, allows the n-channel type field effect transistor turns on. Thus, the control circuit establishes the concurrent off-states, so that no current path is provided between the source of positive voltage level Vdd and the ground node. The time delay is achieved by introducing a difference in resistance between the inverter circuits 11 and 13, or 35 and 37 or between the NAND gate 15 or 33 and the NOR gate 17 or 31. The time delay is also achieved by feedback loops for propagating the driving signals to the previous stages.

The overshoot and the undershoot are restricted by gradual or mild variation of the voltage level in the driving signals. Namely, if the driving signals DRV are gradually varied between the high voltage level and the low voltage level, the p-channel type and n-channel type field effect transistors allow the current passing therethrough to gradually increase or decrease. The overshoot and the undershoot hardly take place in so far as the amount of current is gradually varied.

Figure 3:
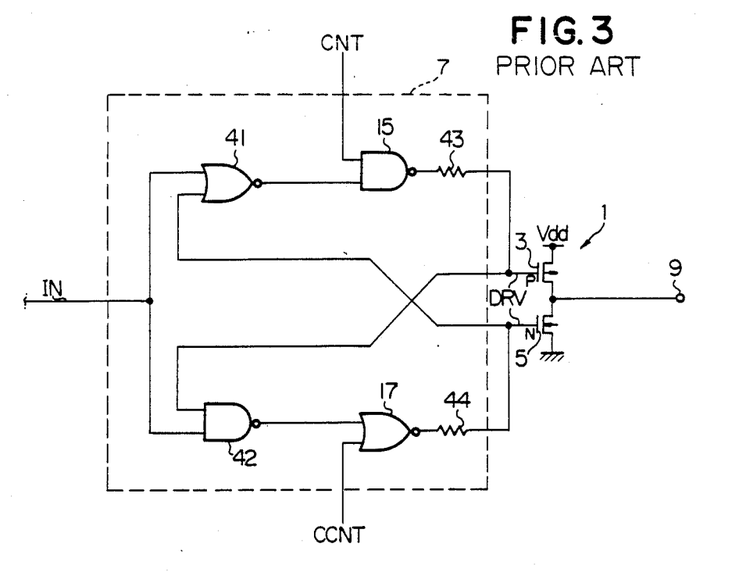
FIG. 3 is a circuit diagram showing the arrangement of still another prior art output circuit aiming at an improvement in stability of the constant voltage level.
Figure 4:
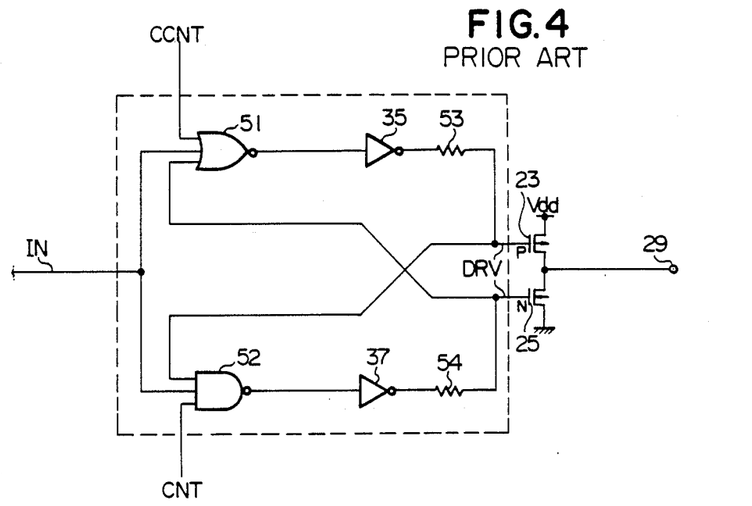
FIG. 4 is a circuit diagram showing the arrangement of still another prior art output buffer circuit which aims at a solution of the drawbacks inherent in the output buffer circuit shown in FIG. 2.

FIGS. 3 and 4 shows two examples of the output buffer circuit proposed for the solution of those drawbacks. Feedback loops are incorporated in the output buffer circuit shown in FIG. 3, and the inverter circuits 11 and 13 are replaced with a NOR gate 41 and a NAND gate 42 for establishing the feedback loops. Two resistors 43 and 44 are provided in association with the NAND gate 42 and the NOR gate 41, respectively. However, the other components are similar to those of the output buffer circuit shown in FIG. 1, and, for this reason, the components are designated by like reference numerals used in FIG. 1 without any further description. The NOR gate 41 and the NAND gate 42 introduce a time delay between the two driving signals DRV for preventing the field effect transistors 3 and 5 from the concurrent on-states, and the resistors 43 and 44 cause the p-channel type and n-channel type field effect transistors to gradually vary the current passing therethrough. Thus, the output buffer circuit shown in FIG. 3 is less liable to produce the undesirable voltage fluctuation. The circuit behavior is similar to the output buffer circuit shown in FIG. 1 with the exception of the time delay hereinbefore described, so that detailed description is omitted for the sake of simplicity.

The output buffer circuit shown in FIG. 4 is also equipped with two feedback loops, and the two-input NOR gate 31 and the two-input NAND gate 33 are replaced with a three-input NOR gate 51 and a three-input NAND gate 52, respectively, for establishing the feedback loops. The feedback loops allow the p-channel type or n-channel type field effect transistor 23 or 25 to turn on after the other field effect transistor turned off. Thus, a time delay is introduced in the switching operations, and, for this reason, the undesirable concurrent on-states do not take place in the p-channel type and n-channel type field effect transistors 23 and 25. The output buffer circuit shown in FIG. 4 further comprises two resistors 53 and 54 which are provided in the feedback loops for gradual variations of the driving signals DRV. The circuit behavior of the output buffer circuit shown in FIG. 4 is similar to that shown in FIG. 2 except for the time delay introduced in the switching operations of the field effect transistors 23 and 25, and no further description is incorporated for avoiding any repetition.

However, a problem is encountered in the prior art output buffer circuits shown in FIGS. 3 and 4 in that there is a trade-off between the solution for the undesirable concurrent on-states and the solution for the overshoot and the undershoot. In detail, the resistors 43, 44, 53 and 54 aims at the gradual variations of the driving signals DRV as described above, and the resistances thereof are inversely proportional to the increment or the decrement of the current passing through the p-channel type and n-channel type field effect transistors 3, 5, 23 and 25. Namely, the larger the resistance, the smaller the variation. If the resistances are large enough to make the variation small, no overshoot and no undershoot take place in the source of positive voltage level and in the ground voltage level. If an extremely large resistances are established in the feedback loops, the pulse transition time periods on the feedback loops become so long that the pulses on the feedback loops are liable to be overlapped with each other, thereby allowing the p-channel type and n-channel type field effect transistors to concurrently turn on. FOr avoiding the undesirable overlapping, if the resistances are selected to be small, the driving signals DRV are steeply varied to produce the undesirable overshoot and the undershoot. This results in that insufficient solutions are merely implemented by the combination of the feedback loops and the resistors.

SUMMARY OF THE INVENTION

It is therefore an important object of the present invention to provide an output buffer circuit which is conducive to maintaining the voltage sources stable.

It is another important object of the present invention to provide an output buffer circuit which prevents the output inverter circuit from the concurrent on-states without any overshoot and undershoot.

To accomplish these objects, the present invention proposes to change the transition speeds of the driving signals between an early stage and a later stage of every alternation period.

In accordance with one aspect of the present invention, there is provided an output buffer circuit for a bit of an input signal, comprising a) an output stage formed by a series combination of first and second field effect transistors supplied with a pair of driving signals, respectively, for being complementarily shifted between on-states and off-states and coupled between first and second constant voltage source respectively producing first and second voltage levels different in voltage level from each other, (b) an output node provided between the first and second field effect transistors, and (c) a controlling stage supplied with the bit of the input signal and operative to produce the driving signals swinging between high and low voltage levels in the same direction in every alternation period, a time delay taking place between the driving signals, in which the controlling stage comprises (c-1) driving signal producing means responsive to the bit of the input signal and operative to produce the driving signals, (c-2) load means coupled to the driving signal producing means and operative to cause the driving signals to gradually swing between the high and low voltage levels, and (c-3) speed controlling means coupled between the gate electrodes of the first and second field effect transistors and the driving signal producing means and operative to slowly vary the driving signals in an early stage of the alternation period and to steeply vary the driving signals in a later stage of the alternation period, thereby preventing the driving signals from overlapping.

In accordance with another aspect of the present invention, there is provided an output facility provided for a multiple-bit input signal having a plurality of data bits, comprising a plurality of output buffer circuits, each of the output buffer circuits comprising (a) an output stage formed by a series combination of first and second field effect transistors supplied with a pair of driving signals, respectively, for being complementarily shifted between on-states and off-states and coupled between first and second constant voltage source respectively producing first and second voltage levels different in voltage level from each other, (b) an output node provided between the first and second field effect transistors, and (c) a controlling stage supplied with the bit of the input signal and operative to produce the driving signals swinging between high and low voltage levels in the same direction in every alternation period, a time delay taking place between the driving signals, in which the controlling stage comprises (c-1) driving signal producing means responsive to the bit of the input signal and operative to produce the driving signals, (c-2) load means coupled to the driving signal producing means and operative to cause the driving signals to gradually swing between the high and low voltage levels, and (c-3) speed controlling means coupled between the gate electrodes of the first and second field effect transistors and the driving signal producing means and operative to slowly vary the driving signals in an early stage of the alternation period and to steeply vary the driving signals in a later stage of the alternation period, thereby preventing the driving signals from overlapping.

BRIEF DESCRIPTION OF THE DRAWINGS

The features and advantages of an output buffer circuit according to the present invention will be more clearly understood from the following description taken in conjunction with the accompanying drawings in which.

DESCRIPTION OF THE PREFERRED EMBODIMENTS

First embodiment

Figure 5:
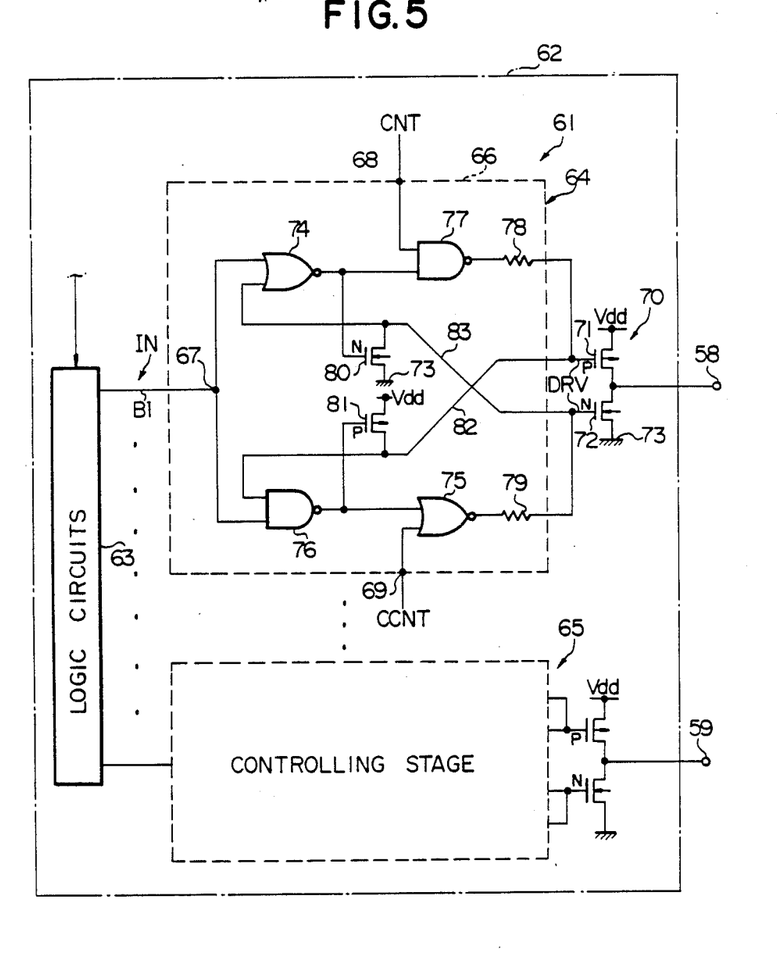
FIG. 5 is a circuit diagram showing the arrangement of an output buffer circuit embodying the present invention.

Referring first to FIG. 5 of the drawings, an output facility 61 is fabricated on a single semiconductor chip 62 together with an internal electronic circuits such as, for example, a logic circuits 63, and the output facility 61 is implemented by a plurality of output buffer circuits 64 to 65 each embodying the present invention, because the logic circuits 63 produce a multiple-bit input signal IN. A plurality of output nodes 58 to 59 are associated with the output facility, and a multiple-bit output signal is supplied to the output nodes 58 to 59. All of the output buffer circuits 64 to 65 are similar in circuit arrangement to one another, and, for this reason, description is made for the output buffer circuit 64 only for the sake of simplicity.

The output buffer circuit 64 largely comprises a controlling stage 66 which is supplied at an input node 67 thereof with a single bit B1 of the multi-bit input signal IN and at control nodes 68 and 69 thereof with a controlling signal CNT and the complementary controlling signal CCNT. The output buffer circuit 64 further comprises an output stage 70 implemented by a complementary inverter circuit, and the complementary inverter circuit is formed by a series combination of a p-channel type field effect transistor 71 and an n-channel type field effect transistor 72 coupled between a source of positive voltage level Vdd and a ground line 73. The gate electrodes of the field effect transistors 71 and 72 are coupled to the controlling stage 66, and the output node 58 is electrically connected to the common drain nodes of the field effect transistors 71 and 72.

The controlling stage 66 comprises two NOR gates 74 and 75, two NAND gates 76 and 77, two resistors 78 and 79, a pull-down transistor 80, and a pull-up transistor 81. Each of the NOR gates 74 and 75 is of the two-input type, and the NAND gates 76 and 77 have two pairs of input nodes, respectively. The input node 67 is coupled in parallel to input nodes of the NOR gate 74 and the NAND gate 76, and the output nodes of these gates 74 and 76 are connected to the input nodes of the NAND gate 77 and the NOR gate 75, respectively. The output nodes of the NAND gate 77 and the NOR gate 75 are respectively coupled to the resistors 78 and 79 which in turn are connected to the other input nodes of the NOR gate 74 and the NAND gate 76 through wirings 82 and 83, respectively. Thus, the resistors 78 and 79 and the wirings 82 and 83 as a whole constitute feedback paths for driving signals DRV. The pull-down transistor 80 is formed by an n-channel type field effect transistor coupled between the wiring 83 and the ground line 73, and the pull-up transistor 81 is formed by a p-channel type field effect transistor coupled between the source of positive voltage level Vdd and the wiring 82. The other input node of the NAND gate 77 is coupled to the control node 68 where a control signal CNT is supplied. On the other hand, the control node 69 is connected to the other input node of the NOR gate 75 for transferring the complementary control signal CCNT to the other input node.

In this instance, the NOR gates 74 and 75 and the NAND gates 76 and 77 as a whole constitute driving signal producing means, and the resistors 78 and 79 form in combination load means. Speed controlling means are implemented by the combination of the pull-down transistor 80 and the pull-up transistor 81.

Description is hereinbelow made for circuit behavior of the output buffer circuit on the assumption that the input bit B1 is shifted from the high voltage level to the low voltage level. Additionally, if the control signal CNT remains in the low voltage level and, accordingly, the complementary control signal CCNT keeps in the high voltage level, the NAND gate 77 and the NOR gate 75 are shifted into the respective inactive states, so that the output node 58 is not affected by any alternation of the input bit B1. However, if the control signal CNT and the complementary control signal CCNT are respectively shifted to the high and low voltage levels, the NAND gate 77 and the NOR gate 75 are activated for alternation of the driving signals DRV.

When the input bit B1 remains in the high voltage level, the NAND gate 77 and the NOR gate 75 produces the driving signals DRV of the high voltage level which is supplied to the output stage 70. With the driving signals DRV of the high voltage level, the p-channel type field effect transistor 71 is turned off, however, the n-channel type field effect transistor 72 is turned on, thereby shifting the output node 58 into the low voltage level. The driving signals DRV are fed back to the NAND and NOR gates 76 and 74, and, accordingly, the NOR gate 74 fixes the output signal thereof in the low voltage level regardless of the alternation of the input bit B1. However, the NAND gate 76 is responsive to the input bit B1 in the presence of the driving signal DRV of the high voltage level. Since the driving signals DRV are in the high voltage level and the output signals from the NOR and the NAND gates 74 and 76 are in the low voltage level, the pull-up and pull-down transistors 81 and 80 are turned off to block respective conduction paths from the wirings 82 and 83, respectively.

Next, if the logic circuits 63 changes the input bit B1 from the high voltage level to the low voltage level, the NAND gate 76 produces the output signal of the high voltage level, however, the NOR gate 74 does not respond to the input bit B1 of the low voltage level.

When the controlling signal CNT is shifted to the active high voltage level, and the complementary controlling signal CCNT is inversely shifted to the low voltage level, the NAND gate 77 as well as the NOR gate 75 are responsive to the output signals from the previous stage, i.e., the NOR gate 74 and the NAND gate 76. However, the NOR gate 74 can not respond to the input bit B1 in this phase, so that the NAND gate 77 continues to produce the driving signal DRV of the high voltage level, which remains the p-channel type field effect transistor in the off-state.

With the input bit B1 of the low voltage level, the NAND gate 76 shifts the output signal thereof to the high voltage level which in turn causes the NOR gate 75 to produce the driving signal DRV of the low voltage level. The driving signal DRV of the low voltage level is transferred from the NOR gate 75 through the resistor 79 to both of the n-channel type field effect transistor 72 and the NOR gate 74. When the driving signal DRV of the low voltage level is supplied to the n-channel type field effect transistor 72, the n-channel type field effect transistor 72 gradually turns off without producing any overshoot and undershoot by virtue of the large resistance of the resistor 79.

Furthermore, the concurrent off-states are established in both of the p-channel and n-channel type field effect transistors 71 and 72, and, for this reason, no current path takes place from the source of positive voltage level through the output stage 70 to the ground line 73. Although the resistor 79 is large in resistance, no concurrent on-states takes place in the p-channel type and n-channel type field effect transistors 71 and 72. This is because of the fact that the NOR gate 74 gradually shifts the output signal thereof toward the high voltage level in the presence of the driving signal DRV swinging its voltage level toward the low voltage level. When the output signal of the NOR gate 74 exceeds the threshold voltage of the n-channel type field effect transistor, the pull-down transistor 80 turns on to rapidly discharge the driving signal DRV from the NOR gate 75 to the ground line 73. This results in that the driving signal DRV from the NOR gate 75 slowly swings its voltage level toward the high voltage level in the early stage of the alternation, however, steeply swings its voltage level to the high voltage level after the pull-down transistor 80 turns on. The steep descent prevents the driving signals from any overlapping, and, for this reason, no concurrent on-states take place in the p-channel type and n-channel type field effect transistors 71 and 72. As described hereinbefore, the concurrent on-states are serious turbulence in the constant voltage sources Vdd and 73. However, no turbulence takes place in the source of positive voltage level Vdd and the ground line 73, so that any fluctuation is produced in their voltage levels.

As described hereinbefore, the NOR gate 74 is responsive to the input bit B1 in the presence of the driving signal DRV of the low voltage level and, accordingly, produces the output signal of the high voltage level on the basis of the input bit B1 of the low voltage level. With the output signal of the high voltage level, the NAND gate 77 produces the driving signal DRV of the low voltage level which is transferred from the NAND gate 77 through the resistor 78 to both of the p-channel type field effect transistor 71 and the NAND gate 76. With the driving signal of the low voltage level, the p-channel type field effect transistor 71 turns on to provide a conduction path from the source of positive voltage level Vdd to the output node 58. This results in that the output node 58 is shifted to the high voltage level. On the other hand, the NAND gate 76 fixes the output signal thereof in the high voltage level in the presence of the driving DRV of the low voltage level, and, accordingly, can not respond to the alternation of the input bit B1. When the output node 58 is changed to the high voltage level, the control signal CNT is recovered to the low voltage level.

Subsequently, the input bit B1 is shifted to the high voltage level again, and the controlling signal CNT goes up to the high voltage level. With the input bit B1 of the high voltage level, the NOR gate 74 shifts the output signal thereof to the low voltage level which in turn causes the NAND gate 77 to produce the driving signal DRV of the high voltage level. The driving signal DRV of the high voltage level is transferred from the NAND gate 77 through the resistor 78 to both of the p-channel type field effect transistor 71 and the NAND gate 76. When the driving signal DRV of the high voltage level is supplied to the p-channel type field effect transistor 71, the p-channel type field effect transistor 71 gradually turns off without producing any overshoot and undershoot by virtue of the large resistance of the resistor 78.

Furthermore, the concurrent off-states are surely established in both of the p-channel and n-channel type field effect transistors 71 and 72, and, for this reason, no current path takes place from the source of positive voltage level Vdd through the output stage 70 to the ground line 73. Although the resistor 78 is large in resistance, no concurrent on-states takes place in the p-channel type and n-channel type field effect transistors 71 and 72. This is because of the fact that the NAND gate 76 gradually shifts the output signal thereof toward the high voltage level in the presence of the driving signal DRV swinging its voltage level toward the high voltage level. When the output signal of the NAND gate 76 is dropped below the threshold voltage of the p-channel type field effect transistor, the pull-up transistor 81 turns on to rapidly charge up the wiring 82. This results in that the driving signal DRV from the NAND gate 77 slowly swings its voltage level toward the low voltage level in the early stage of the alternation, however, steeply reaches the low voltage level after the pull-up transistor 81 turns on. The steep ascent prevents the driving signals from any overlapping, and, for this reason, no concurrent on-states take place in the p-channel type and n-channel type field effect transistors 71 and 72. As described hereinbefore, the concurrent on-states are serious turbulence in the constant voltage sources Vdd and 73. However, no turbulence takes place in the source of positive voltage level Vdd and the ground line 73, so that any fluctuation is produced in their voltage levels.

As described hereinbefore, the NAND gate 76 is responsive to the input bit B1 in the presence of the driving signal DRV of the high voltage level and, accordingly, produces the output signal of the low voltage level on the basis of the input bit B1 of the high voltage level. With the output signal of the low voltage level, the NOR gate 75 produces the driving signal DRV of the high voltage level which is transferred from the NOR gate 75 through the resistor 79 to both of the n-channel type field effect transistor 72 and the NOR gate 74. With the driving signal of the high voltage level, the n-channel type field effect transistor 72 turns on to provide a conduction path from the output node 58 to the ground line 73. This results in that the output node 58 is shifted to the low voltage level. On the other hand, the NOR gate 74 fixes the output signal thereof in the low voltage level in the presence of the driving signal DRV of the high voltage level, and, accordingly, can not respond to the alternation of the input bit B1. When the output node 58 is changed to the low voltage level, the control signal CNT is recovered to the low voltage level.

Second embodiment

Figure 6:
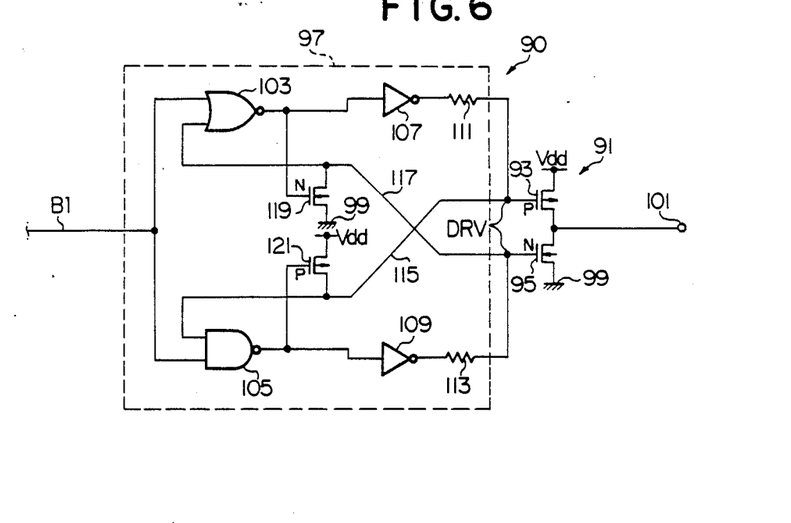
FIG. 6 is a circuit diagram showing the arrangement of an output buffer circuit embodying the present invention.

Turning to FIG. 6, another output buffer circuit 90 is illustrated. The output buffer circuit 90 forms a part of an output facility of an integrated circuit in a similar manner to the output buffer circuit 64 illustrated in FIG. 5. The output buffer circuit 90 comprises a complementary inverter circuit 91 consisting of a p-channel type field effect transistor 93 and an n-channel type field effect transistor 95, and a controlling circuit 97 for the complementary inverter circuit 91. The complementary inverter circuit 91 is coupled between a source of positive voltage level Vdd and a ground line 99, and an output node 101 is provided between the p-channel type field effect transistor 93 and the n-channel type field effect transistor 95. The control circuit 97 has a two-input NOR gate 103, and a two input NAND gate 105, and two inverter circuits 107 and 109. An input bit B1 is shared by the NAND gate 105 and the NOR gate 103, and the output nodes of the NOR and NAND gates 103 and 105 are coupled to the inverter circuits 107 and 109, respectively, which in turn are coupled to resistors 111 and 113, respectively. The resistors 111 and 113 are coupled in parallel to not only the gate electrodes of the p-channel type and n-channel type field effect transistors 93 and 95 but also the other input nodes of the NAND and NOR gates 105 and 103 through wirings 115 and 117. Either NOR or NAND gate is activated by driving signals DRV, however, the other gate remains in the inactive state in the presence of the driving signals DRV. However, the other gate is activated to shift the output signal thereof after one of the driving signals DRV is changed in voltage level by the active gate. Thus, the NOR and NAND gates 103 and 105 sequentially shift the output signal thereof, so that no current path is established between the source of positive voltage level Vdd and the ground line 99.

The controlling circuit 97 further comprises a pull-down transistor 119 and a pull-up transistor 121 coupled between the wiring 115 and the ground line 99 and between the wiring 117 and the source of positive voltage Vdd, respectively. The behavior of these pull-down and pull-up transistors 119 and 121 are similar to the transistors 80 and 81, so that detailed description is omitted for the sake of simplicity.

Third embodiment

Figure 7:
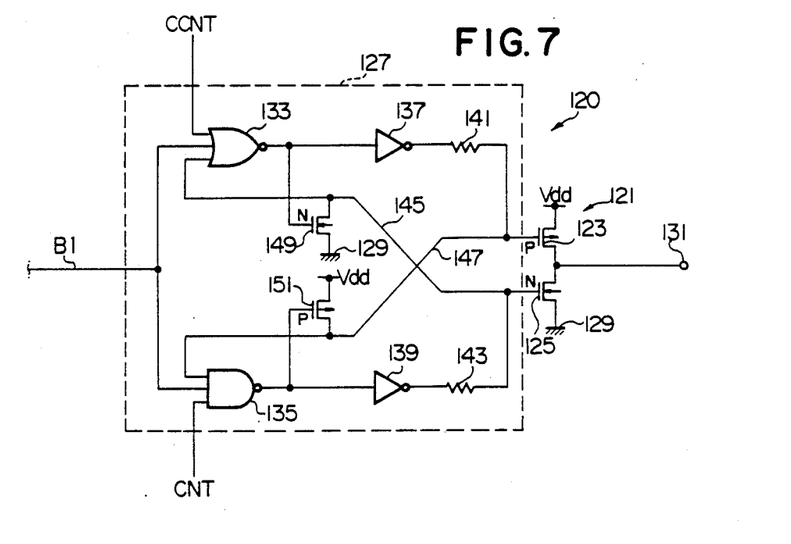
FIG. 7 is a circuit diagram showing the arrangement of still another output buffer circuit embodying the present invention.

Turning to FIG. 7, still another output buffer circuit 120 is illustrated. The output buffer circuit 120 forms a part of an output facility as similar to the output buffer circuit 90. The output buffer circuit 120 comprises a complementary inverter circuit 121 consisting of a p-channel type field effect transistor 123 and an n-channel type field effect transistor 125, and a controlling circuit 127 for the complementary inverter circuit 121. The complementary inverter circuit 121 is coupled between a source of positive voltage level Vdd and a ground line 129, and an output node 131 is provided between the p-channel type field effect transistor 123 and the n-channel type field effect transistor 125. The control circuit 127 has a three-input NOR gate 133, and a three-input NAND gate 135, and two inverter circuits 137 and 139. An input bit B1 is shared by the NAND gate 135 and the NOR gate 133, and the output nodes of the NOR and NAND gates 133 and 135 are coupled to the inverter circuits 137 and 139, respectively, which in turn are coupled to resistors 141 and 143, respectively. The resistors 141 and 143 are coupled in parallel to not only the gate electrodes of the p-channel type and n-channel type field effect transistors 123 and 125 but also other input nodes of the NAND and NOR gates 135 and 133 through wirings 145 and 147. The third input nodes of the NAND and NOR gates 135 and 133 are supplied with a controlling signal CNT and the complementary signal thereof, respectively, and are allowed to shift the output signal thereof in the co-presence of the control signal of the high voltage level and the complementary signal of the low voltage level. One of the NOR and NAND gates 133 and 135 is restricted to shift the output signal thereof with the driving signal DRV even if the control signal or the complementary signal allows it to shift the output signal. Namely, the NOR gate 133 can not change the output signal in the presence of the driving signal DRV of the high voltage level, and, on the other hand, the NAND gate 135 fixes the output signal thereof in the presence of the driving signal of the low voltage level. Thus, the NOR gate 133 and the NAND gate 135 are locked by both of the control signal (and the complementary signal) and the driving signals DRV.

The controlling circuit 127 further comprises a pull-down transistor 149 and a pull-up transistor 151 coupled between the wiring 145 and the ground line 129 and between the wiring 147 and the source of positive voltage Vdd, respectively. The behavior of these pull-down and pull-up transistors 149 and 151 are similar to the transistors 80 and 81, so that detailed description is omitted for the sake of simplicity.

Although particular embodiments of the present invention have been shown and described, it will be obvious to those skilled in the art that various changes and modifications may be made without departing from the spirit and scope of the present invention.

What is claimed is:

1. An output buffer circuit for a bit of an input signal, comprising
   (a) an output stage formed by a series combination of first and second field effect transistors supplied with a pair of driving signals, respectively, for being complementarily shifted between on-states and off-states and coupled between first and second constant voltage sources respectively producing first and second voltage levels different in voltage level from each other, said driving signals taking high and low voltage levels in first and second states, respectively, (b) an output node provided between said first and second field effect transistors, and (c) a controlling stage supplied with the bit of said input signal and operative to change the levels of said driving signals from one of said high and low voltage levels to the other of the high and low voltage levels through a transition period between said first and second states, a time delay taking place between the driving signals, in which said controlling stage comprises, (c-1) driving signal producing means responsive to the bit of said input signal and operative to produce said driving signals, (c-2) load means coupled to said driving signal producing means and operative to cause said driving signals to gradually swing between said high and low voltage levels, and (c-3) speed controlling means coupled between gate electrodes of said first and second field effect transistors and said driving signal producing means and responsive to voltage levels at the gate electrodes of said first and second transistors for accelerating changes in said first and second driving signals in said transition period thereby to slowly vary said driving signals in an early stage of said transition period and to rapidly vary said driving signal in a later stage of said transition period, thereby preventing said driving signals from overlapping in said transition period.

2. An output buffer circuit as set forth in claim 1, in which said driving signal producing means comprise a two-input NOR gate supplied at one input node thereof with the input bit, a two-input NAND gate supplied at one input node thereof with the input bit, and two inverter circuits coupled to the output nodes of said NOR and NAND gates, respectively, and in which said load means comprises first and second resistors coupled between the output nodes of said inverter circuits and the other input nodes of said NAND and NOR gates, respectively, wherein said first and second resistors are further coupled to the gate electrodes of said first and second field effect transistors, respectively.

3. An output buffer circuit as set forth in claim 2, in which said speed controlling means comprises third and fourth field effect transistors opposite in channel conductivity type and coupled between said second and first resistors and said constant voltage sources, respectively, and in which said third and fourth field effect transistors have respective gate electrodes coupled to the output nodes of said two-input NOR gate and said two-input NAND gate, respectively.

4. An output buffer circuit as set forth in claim 3, in which said first and fourth field effect transistors are of the p-channel and enhancement-mode type, and in which said second and third field effect transistors are of the n-channel and enhancement-mode type.

5. An output buffer circuit as set forth in claim 1, in which said driving signal producing means comprise a three-input NOR gate supplied at the first input node thereof with the input bit, a three-input NAND gate supplied at one input node thereof with the input bit, and two inverter circuits coupled to the output nodes of said NOR and NAND gates, respectively, and in which said load means comprises first and second resistors coupled between the output nodes of said inverter circuits and the second input nodes of said NAND and NOR gates, respectively, the third input nodes of said NAND and NOR gates being supplied with a controlling signal and the complementary signal thereof, respectively, wherein said first and second resistors are further coupled to the gate electrodes of said first and second field effect transistors, respectively.

6. An output buffer circuit as set forth in claim 5, in which said speed controlling means comprises third and fourth field effect transistors opposite in channel conductivity type and coupled between said second and first resistors and said constant voltage sources, respectively, and in which said third and fourth field effect transistors have respective gate electrodes coupled to the output nodes of said three-input NOR gate and said three-input NAND gate, respectively.

7. An output buffer circuit as set forth in claim 6, in which said first and fourth field effect transistors are of the p-channel and enhancement-mode type, and in which said second and third field effect transistors are of the n-channel and enhancement-mode type.

8. An output facility provided for a multiple-bit input signal having a plurality of data bits, comprising a plurality of output buffer circuits, each of said output buffer circuits comprising:

(a) an output stage formed by a series combination of first and second field effect transistors supplied with a pair of driving signals, respectively, for being complementarily shifted between on-states and off-states and coupled between first and second voltage levels different in voltage level from each other, said driving signals taking high and low voltage levels in first and second states, respectively, (b) an output node provided between said first and second field effect transistors, and (c) a controlling stage supplied with a bit of said input signal and operative to change the levels of said driving signals from one of said high and low voltage levels to the other of the high and low voltage levels through a transition period between said first and second states, a time delay taking place between the driving signals, in which said controlling stage comprises, (c-1) driving signal producing means responsive to the bit of said input signal and operative to produce said driving signals, (c-2) load means coupled to said driving signal producing means and operative to cause said driving signals to gradually swing between said high and low voltage levels, and (c-3) speed controlling means coupled between gate electrodes of said first and second field effect transistors and said driving signal producing means and responsive to voltage levels at the gate electrodes of said first and second field effect transistors for accelerating changes in said first and second driving signals in said transition period thereby to slowly vary said driving signals in an early stage of said transition period and to rapidly vary said driving signal in a later stage of said transition period, thereby preventing said driving signals from overlapping.

9. An output buffer circuit for a bit of an input signal, comprising:

(a) an output stage formed by a series combination of first and second field effect transistors supplied with a pair of driving signals, respectively, for being complementarily shifted between on-states and off-states and coupled between first and second constant voltage sources respectively producing first and second voltage levels different in voltage level from each other, said driving signals taking high and low voltage levels in first and second states, respectively, (b) an output node provided between said first and second field effect transistors, and (c) a controlling stage supplied with the bit of said input signal and operative to change the levels of said driving signals from one of said high and low voltage levels to the other of the high and low voltage levels through a transition period between said first and second states, a time delay taking place between the driving signals, in which said controlling stage comprises, (c-1) driving signal producing means responsive to the bit of said input signal and operative to produce said driving signals, (c-2) load means coupled to said driving signal producing means and operative to cause said driving signals to gradually swing between said high and low voltage levels, and (c-3) speed controlling means coupled between gate electrodes of said first and second field effect transistors and said driving signal producing means and responsive to levels at the gate electrodes of said first and second transistors for accelerating changes in said first and second driving signals in said transition period thereby to slowly vary said driving signals in an early stage of said transition period and to rapidly vary said driving signal in a later stage of said transition period, thereby preventing said driving signals from overlapping in said transition period, wherein said driving signal producing means comprise a first two-input NOR gate supplied at one input node thereof with said input bit, a first two-input node NAND gate supplied at one input node thereof with the input bit, a second two-input NAND gate coupled at one input node thereof to the output node of said first two-input NOR gate and supplied at the other input node thereof with a controlling signal, and a second two-input NOR gate coupled at one input node thereof to the output node of said first two-input NAND gate and supplied at the other input node thereof with the complementary signal of said controlling signal, and in which said load means comprises first and second resistors coupled between the output node of said second two-input NAND gate and the other input node of said first two-input NAND gate and between the output node of said second two-input NOR gate and the other input node of said first two-input NOR gate, wherein said first and second resistors are further coupled to the gate electrodes of said first and second field effect transistors, respectively.

10. An output buffer circuit as set forth in claim 9, in which said speed controlling means comprises third and fourth field effect transistors opposite in channel conductivity type and coupled between said second and first resistors and said constant voltage sources, respectively, and in which said third and fourth field effect transistors have respective gate electrodes coupled to the output nodes of said first two-input NOR gate and said first two-input NAND gate, respectively.

11. An output buffer circuit as set forth in claim 10, in which said first and fourth field effect transistors are of the p-channel and enhancement-mode type, and in which said second and third field effect transistors are of the n-channel and enhancement-mode type.

* * * * *